(12) United States Patent
Cabanne et al.

(10) Patent No.: US 9,605,826 B2
(45) Date of Patent: Mar. 28, 2017

(54) MOTOR VEHICLE LIGHTING AND/OR SIGNALLING DEVICE

(71) Applicant: VALEO ILUMINACION, Martos (ES)

(72) Inventors: Damien Cabanne, Martos (ES); Manuel Gomez, Jaen (ES); Juan Antonio Rubia Mena, Martos (ES); Jose-Antonio Aguilar Del Moral, Jaen (ES); Carlos Gomez, Martos (ES); Eric Moisy, Jaen (ES)

(73) Assignee: Valeo Iluminacion, Martos (ES)

( * ) Notice: Subject to any disclaimer, the term of this patent is extended or adjusted under 35 U.S.C. 154(b) by 0 days.

(21) Appl. No.: 14/647,232

(22) PCT Filed: Nov. 28, 2013

(86) PCT No.: PCT/EP2013/075004
§ 371 (c)(1),
(2) Date: May 26, 2015

(87) PCT Pub. No.: WO2014/083122
PCT Pub. Date: Jun. 5, 2014

(65) Prior Publication Data
US 2015/0338049 A1 Nov. 26, 2015

(30) Foreign Application Priority Data
Nov. 30, 2012 (FR) ..................... 12 61519

(51) Int. Cl.
*F21S 8/10* (2006.01)
*F21Y 101/00* (2016.01)

(52) U.S. Cl.
CPC ....... *F21S 48/1109* (2013.01); *F21S 48/1118* (2013.01); *F21S 48/1159* (2013.01);
(Continued)

(58) Field of Classification Search
CPC F21S 48/1109; F21S 48/1118; F21S 48/1159; F21S 48/1305; F21S 48/321; F21S 48/328; F21Y 2101/00; H01L 2924/0002
See application file for complete search history.

(56) References Cited

U.S. PATENT DOCUMENTS 4,614,997 A   9/1986 Montet
4,947,306 A * 8/1990 O'Shaughnessey . B60Q 1/0683
                                                  362/271
(Continued)

FOREIGN PATENT DOCUMENTS

DE    102010049105    5/2011
DE    102010048595    4/2012
(Continued)

*Primary Examiner* — Anh Mai
*Assistant Examiner* — Fatima Farokhrooz
(74) *Attorney, Agent, or Firm* — Jacox, Meckstroth & Jenkins

(57) ABSTRACT

An optical module for a motor vehicle lighting and/or signaling device, having an optical deflection element, a support to which the optical deflection element is fixed, the support comprises adapter fixing means capable of fixing an adapter to which a light source is fixed, and wherein the first optical deflection element comprises adapter indexing means arranged so as to be capable of positioning this adapter relative to the first optical deflection element on two separate intersecting axes.

18 Claims, 6 Drawing Sheets

(52) U.S. Cl.
CPC ......... *F21S 48/1305* (2013.01); *F21S 48/321* (2013.01); *F21S 48/328* (2013.01); *F21Y 2101/00* (2013.01); *H01L 2924/0002* (2013.01)

(56) References Cited

U.S. PATENT DOCUMENTS

| | | | |
|---|---|---|---|
| 4,959,758 A * | 9/1990 | Filosa | B60Q 1/0683 362/273 |
| 5,769,525 A * | 6/1998 | Daumueller | B60Q 1/1415 362/255 |
| 5,833,346 A * | 11/1998 | Denley | B60Q 1/0686 33/288 |
| 6,663,268 B1 * | 12/2003 | Toda | B60Q 1/115 362/271 |
| 6,819,506 B1 * | 11/2004 | Taylor | F21L 4/005 359/708 |
| 7,518,875 B2 | 4/2009 | Desrosiers et al. | |
| 7,697,299 B2 | 4/2010 | Desrosiers et al. | |
| 7,712,948 B2 | 5/2010 | Schug et al. | |
| 7,798,691 B2 | 9/2010 | Peters et al. | |
| 8,967,843 B2 | 3/2015 | Jackl et al. | |
| 2002/0071286 A1 * | 6/2002 | Taniuchi | F21S 48/1388 362/514 |
| 2007/0076420 A1 * | 4/2007 | Hayashi | B60Q 1/0041 362/514 |
| 2008/0144289 A1 * | 6/2008 | Desrosiers | G01R 1/0458 361/719 |
| 2008/0205055 A1 | 8/2008 | Schug et al. | |
| 2008/0266890 A1 * | 10/2008 | Mochizuki | B60Q 1/076 362/524 |
| 2008/0316764 A1 | 12/2008 | Peters et al. | |
| 2009/0103270 A1 | 4/2009 | Desrosiers et al. | |
| 2011/0080092 A1 * | 4/2011 | Matsumoto | F21S 48/1104 315/82 |
| 2012/0300485 A1 * | 11/2012 | Lee | B60Q 1/143 362/514 |
| 2013/0215632 A1 * | 8/2013 | Jackl | F21S 48/1109 362/514 |
| 2015/0204503 A1 * | 7/2015 | Krenn | F21S 48/1159 362/514 |
| 2015/0241011 A1 * | 8/2015 | Bauer | F21S 48/1159 362/514 |

FOREIGN PATENT DOCUMENTS

| | | |
|---|---|---|
| EP | 0145556 | 6/1985 |
| FR | 2950129 | 3/2011 |
| JP | 2008108613 | 5/2008 |
| JP | 2010182486 | 8/2010 |
| JP | 2011198498 | 10/2011 |
| WO | 2005027598 | 3/2005 |
| WO | 2012048351 | 4/2012 |

* cited by examiner

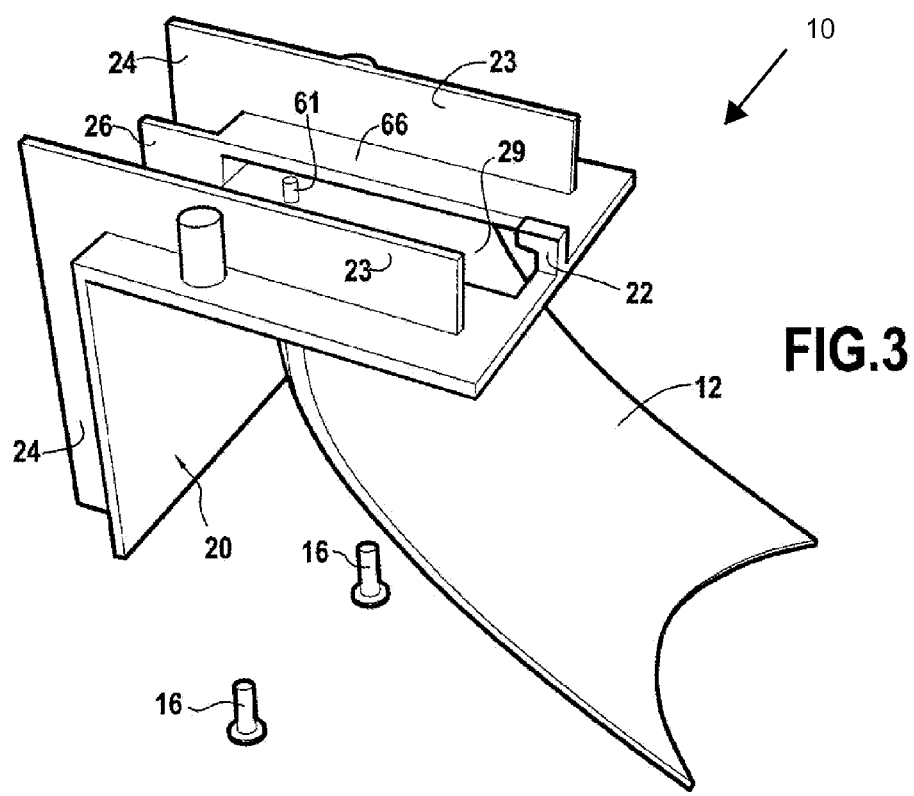
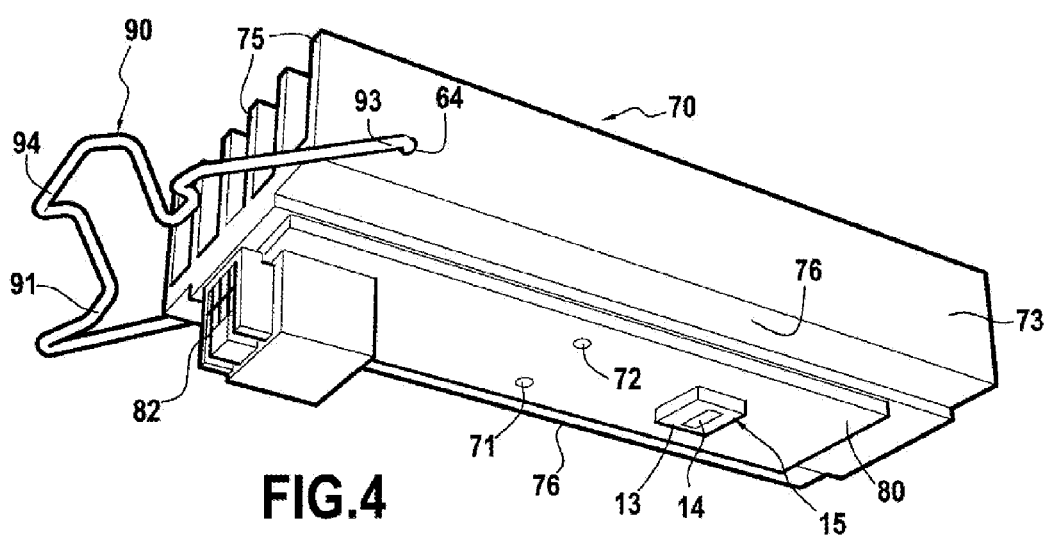

MOTOR VEHICLE LIGHTING AND/OR SIGNALLING DEVICE

CROSS-REFERENCE TO RELATED APPLICATIONS

This application is the U.S. National Phase application of PCT Application No. PCT/EP2013/075004 filed on Nov. 28, 2013, which claims priority to the French application 1261519 filed on Nov. 30, 2012, which applications are incorporated herein by reference and made a part hereof.

BACKGROUND OF THE INVENTION

1. Field of the Invention

The invention relates to a lighting and/or signaling device comprising, or intended to comprise, a light source adapter, particularly a light-emitting diode, intended to bear on the support of a first optical element of this module. It also relates to the corresponding adapter.

2. Description of the Related Art

Motor vehicle lighting and/or signaling devices, such as headlights and rear lights, consist of a housing sealed by a sealing lens and containing one or more optical modules. The light beams emitted by these devices are formed by the optical module or modules, which may operate in combination or separately. These optical modules comprise a light source associated with one or more optical deflection elements, and with shields if necessary, to modulate the shape of the beam and the distribution of the luminous intensity in this beam.

The document FR2950129 comprises an optical module using an LED, wherein, in order to allow the control of the power supply to this LED the latter is placed on a printed circuit. The printed circuit on which the LED is fixed is fixed to an adapter which positions it in the optical module. This adapter enables the LED of this module to be changed by removing and replacing the adapter. The positioning of the adapter must be precise so that the association with the optical elements generates a light beam having the desired shape. In particular, the photoemissive element must be positioned precisely relative to the focus of the first optical element, which collects the rays emitted from the surface of the photoemissive element.

For this purpose, this support is indexed in the three directions of space, X, Y, Z, with respect to the support of the optical element.

One problem tackled by the present invention is that of improving this positioning.

SUMMARY OF THE INVENTION

The invention therefore proposes an optical module for a motor vehicle lighting and/or signaling device comprising:
a first optical deflection element,
a support of this optical deflection element, the first optical deflection element being fixed to the support,
wherein the support comprises adapter fixing means capable of fixing an adapter to which a light source is fixed, or of receiving a fixing element of this adapter, and wherein the first optical deflection element comprises adapter indexing means arranged so as to be capable of positioning this adapter relative to the first optical deflection element according to two separate intersecting axes.

Thus this module will be capable of receiving an adapter which is to be indexed directly on the optical element, also called the optical deflection element in the present application, at least on two separate intersecting axes. By comparison with the prior art, the present applicant might have attempted to improve the precision of machining or manufacture of the elements, and to position them even more precisely during assembly. In his inventive activity, the applicant has taken a different approach and found a solution enabling him to decrease his tolerance stack-up, which, notably in view of the examples disclosed in the prior art, notably in view of FR2950129, is not evident. The applicant has dispensed with the indexing on the element support taught by the prior art, and has discovered means of directly indexing the light source on the optical element on at least two axes. In this way a reduced tolerance stack-up on these two axes is achieved, as well as greater precision. It should be noted that this advantage is obtained while the fixing of the optical deflection element to the support is retained, allowing forces to be exerted on the support, rather than directly on the optical deflection element, during the dismounting of the adapter.

The solution proposed by the invention is therefore particularly appropriate for the replacement of the light source, notably in the case of an LED.

The optical module according to the invention may also have, in addition to the main characteristics stated in the preceding paragraphs, one or more of the following complementary characteristics:

the optical deflection element may be, notably, a reflector, an optical lens, or a light guide.

the indexing means of the support comprise apertures and/or studs; this enables an adapter having complementary shapes to be positioned and indexed by simple movements; these means are also easy to provide;

the support of the optical deflection element is a heat sink, and comprises:
a material capable of conducting heat,
contact surfaces comprising part of this material, such as to transmit the heat of an element that may be in contact with the contact surfaces;

this support may also be capable of acting as a heat sink for the adapter to be mounted thereon, and in particular of directly dissipating the heat given off by the light source fixed to the adapter; the support may comprise fins, in which case the support is a finned radiator;

the support may comprise rear fins located at the rear of the support and behind the optical deflection element relative to the direction of propagation along which the optical deflection element is intended to deflect the rays; this enables the heat to be removed toward the rear, once the module has been mounted inside a lighting and/or deflection device; furthermore, the exchange surface is increased without hindrance on the path of the light rays emitted by the source and deflected by the optical deflection element;

the rear fins comprise a discontinuity arranged so as to form a space free of fins, in which at least a part of the adapter fixing means is located; in this way the compactness of the system is improved;

the support also comprises a connector intended to be connected, on the one hand, to the electrical power supply of a vehicle, and on the other hand to the light source, the connector being housed in the space free of fins;

the support is L-shaped and comprises:
the rear fins on a first branch of the L-shape,
if necessary, other fins, on a second branch of the L-shape;

this makes it possible to have a simple design for the distribution of the fins, the optical deflection element being mountable, for example, between the branches of the L-shape to improve heat dissipation;

the adapter fixing means, that is to say the means intended to fix an adapter to the module, comprise at least one lug with at least one indentation capable of receiving a metal fixing rod; this is a simple means of fixing; the use of the rod for fixing enables the parts to be pressed against one another, using the spring action of the rod;

the adapter fixing means comprise another indentation capable of receiving a metal fixing rod, in such a way that each indentation defines a different fixing position of the metal rod; this enables a pre-positioning of an adapter to be defined during its replacement;

the support comprises a metal rod pivoted at one end on the support, the rod further comprising a fixing part intended to be fixed to the adapter, the rod being arranged to allow compression fixing to module; thus a simple means of attachment is provided, avoiding the use of screws which would require the use of a screwdriver during replacement; additionally, during the replacement of the light source and its adapter, there is no risk that this fixing means might fall into the lighting and/or signaling device in which the module is mounted;

according to a simple embodiment, the pivot comprises a through hole in which an end of the metal rod (190; 290) is freely rotatable;

the pivot is arranged on a fin of the optical deflection element support, or on a projecting part separate from the fins; this pivot is simple to produce;

the metal rod comprises an attachment part capable of interacting with an indentation of the adapter fixing means; the fixing can thus be carried out easily in a single movement, thereby facilitating the replacement of the adapter, this being all the more advantageous in that access to the lighting and/or signaling device is sometimes difficult in a vehicle;

the metal rod comprises a graspable portion in the form of a loop intended to be gripped to enable the rod to be detached from the adapter fixing means;

the rod is in the form of a loop, which may or may not be closed, and which is pivoted at one end and fixed to the adapter fixing means at the other end;

the support comprises:
an opening facing the optical deflection element,
guide fins on either side of this opening, notably parallel with one another,
bearing surfaces between this opening and these guide fins, the guide fins being arranged so as to allow the guiding of a unit having a width close to the distance between these guide fins, to position the unit in contact with these bearing surfaces; thus, if the adapter is a unit of this type, it can be made to slide even when module is difficult to access and/or if it is invisible or poorly visible; the bearing surfaces may be the contact surfaces mentioned previously;

the contact surfaces are covered by a compressible heat-conducting element, notably a filled silicone; this enables the compressible element to be compressed until the adapter touches the optical deflection element and is then indexed on a third axis, not on the support, the adapter thus being indexed directly on the optical deflection element in all directions in space.

The invention also proposes an adapter that can be replaced in an optical module according to the invention, and in particular a light source adapter, comprising:
at least one light source,
a printed circuit, to which the light source is fixed and connected,
complementary fixing means capable of enabling the adapter to be fixed,
complementary indexing means formed on the printed circuit, arranged so that, when an element is positioned relative to these indexing means, the adapter is positioned relative to this element on two separate intersecting axes.

Thus it will be possible to index this adapter precisely relative to these indexing means, particularly with a module according to the invention. This is particularly useful in the context of replacement of the light source, since this replacement can be carried out on the vehicle.

It also makes it possible to have an adapter carrying a standard light source that can be adapted to different types of optical modules. This adapter can be designed for LEDs, which is even more advantageous. This is because an LED is an electronic component, and in many designs of optical modules the failure of the LED requires the replacement of the whole module, or even of the lighting and/or signaling device. Thanks to the invention, it is possible to replace a smaller part of the module, namely the adapter and its light source. Thus the cost of replacement is reduced.

It should be noted that this printed circuit may be a printed circuit card, and the adapter may comprise a support unit, for example a radiator, on which the printed circuit is fixed. This circuit may also be directly formed or printed on the support unit, which, in this case also, may be a radiator. The support unit may comprise fins.

This adapter may also have, in addition to the main characteristics stated in the preceding paragraphs, one or more of the following complementary characteristics:

the complementary indexing means are apertures; this is a simple means of construction;

the apertures are holes passing through the printed circuit from one side to the other; in this way the positioning is reinforced;

the adapter comprises a support unit on which the printed circuit is fixed, the support unit comprising cavities facing the through holes, each through hole opening entirely into its own cavity; this provides a greater tolerance on the length of the indexing means of the various types of module on which the adapter can be mounted;

the adapter comprises a metal rod pivoted at one end on the adapter, the rod further comprising a fixing part to be fixed to an element such as an optical module, the rod being arranged to allow compression fixing of the adapter to this element;

the pivot comprises a through hole in which an end of the metal rod is freely rotatable;

the pivot is arranged on a fin of the adapter, or on a projecting part separate from the fins of the adapter;

the metal rod comprises a portion capable of interacting with an indentation;

the metal rod comprises a graspable portion in the form of a loop intended to be gripped to enable the rod to be detached;

the rod is in the form of a loop, which may or may not be closed, and which is pivoted at one end and has a portion capable of interacting with an indentation at the other end;

the adapter comprises a connector connected to the light source and capable of being connected to an electrical power source to supply the light source.

The invention also proposes a module as described previously, equipped with the adapter appropriate for it, notably a module as described previously, comprising:

an adapter fixed to the optical deflection element support using the adapter fixing means, at least one light source fixed directly or indirectly to the adapter and emitting light rays toward the first optical deflection element, the support being arranged to allow the passage of these light rays, wherein the adapter comprises complementary indexing means interacting with the adapter indexing means so that the adapter and the first optical deflection element are positioned on two separate intersecting axes relative to one another.

The optical module according to the invention may also have, in addition to the main characteristics stated in the preceding paragraphs, one or more of the following complementary characteristics:

the adapter indexing means are apertures, wherein the complementary indexing means are a shape complementary to the shape of this aperture and are housed within this aperture;

the complementary adapter indexing means are apertures, wherein the adapter indexing means have a shape complementary to the shape of these apertures and are housed within these apertures;

the adapter comprises complementary fixing means interacting with the adapter fixing means which are carried by the support;

these complementary fixing means or these adapter fixing means comprise a spring integral with the support and with the adapter, arranged so as to press the support against the adapter; this spring may be a metal rod;

the adapter is an adapter proposed by the invention, as described previously;

the support comprises a projecting toothlike part housed between two fins of the adapter; this tooth may be designed with a clearance, in which case it acts solely as a guide means during replacement; the adapter may also bear against this tooth, in which case it also acts as a means for fixing the adapter;

the support comprises a projecting toothlike part and, the projecting part comprising the pivot of a metal rod for fixing the adapter to the adapter fixing means, the projecting part comprising the pivot of the metal rod;

a metal rod is pivoted at one end to the support, and an attachment part of the rod is attached to an adapter fixing means carried by the support, the rod comprising a pressing portion located between the pivoted end and the attachment part, the pressing portion bearing against the adapter so as to press the latter against the support; this is a simple fixing method enabling the elastic or spring action of the rod to be used to fix the adapter to the module by a single swinging and attachment movement;

the adapter has contact surfaces pressed into direct or indirect contact with contact surfaces of the support; the retention is secure; in order to reinforce the retention further, these contact surfaces may be flat;

the optical module comprises a compressible heat-conducting element, notably a filled silicone, located between these contact surfaces;

the adapter being in direct contact with the optical deflection element, so that the adapter is indexed relative to the optical deflection element on another axis, separate from the other two axes; the adapter being thus indexed directly on the optical deflection element in all the directions of space;

these contact surfaces are in direct or indirect thermal contact, so that the adapter and the support of the optical deflection element form a single heat sink; module is particularly effective because the heat dissipation takes place as closely as possible to the base of the light source, which is even more advantageous when the light source is an LED;

the single heat sink comprises fins, some of which are located on the adapter, while the others are located on the support;

the adapter comprises a connector connected to the light source, and wherein the support also comprises a connector, one of the connectors being plugged into the other; the arrangement of the two connectors can thus be such that the connectors are plugged in directly when the adapter is positioned and fixed;

In the optical modules and the adapters according to the invention, the adapter may comprise a plurality of light sources.

In the optical modules and the adapters according to the invention, the light source or sources may be one or more light-emitting diodes. The modules according to the invention are particularly suitable for LEDs, because:

they allow the LEDs to be replaced in restricted spaces, they allow precise positioning of the LED relative to the optical element, the reflector fixing exerts less stress on this optical element, the fixing being made to a support which is separate from the optical element, according to the variant embodiments, they allow good thermal removal of the heat given off by the LED or LEDs.

Another object of the invention is a vehicle lighting and/or signaling device comprising a module according to the invention. For example, the device may be a headlight, also called a vehicle headlamp.

The optical module may be a lighting module, for example in order to provide an illuminating beam or a low beam.

BRIEF DESCRIPTION OF THE ACCOMPANYING DRAWINGS

Other characteristics and advantages of the invention will be made clear by the following detailed description, the comprehension of which will be facilitated by reference to the attached drawings, in which:

FIG. 3 is a perspective view of the optical module of FIG. 1 without its adapter;

FIG. 4 is a perspective view of the adapter of FIG. 1 without the optical module;

Figure 6:
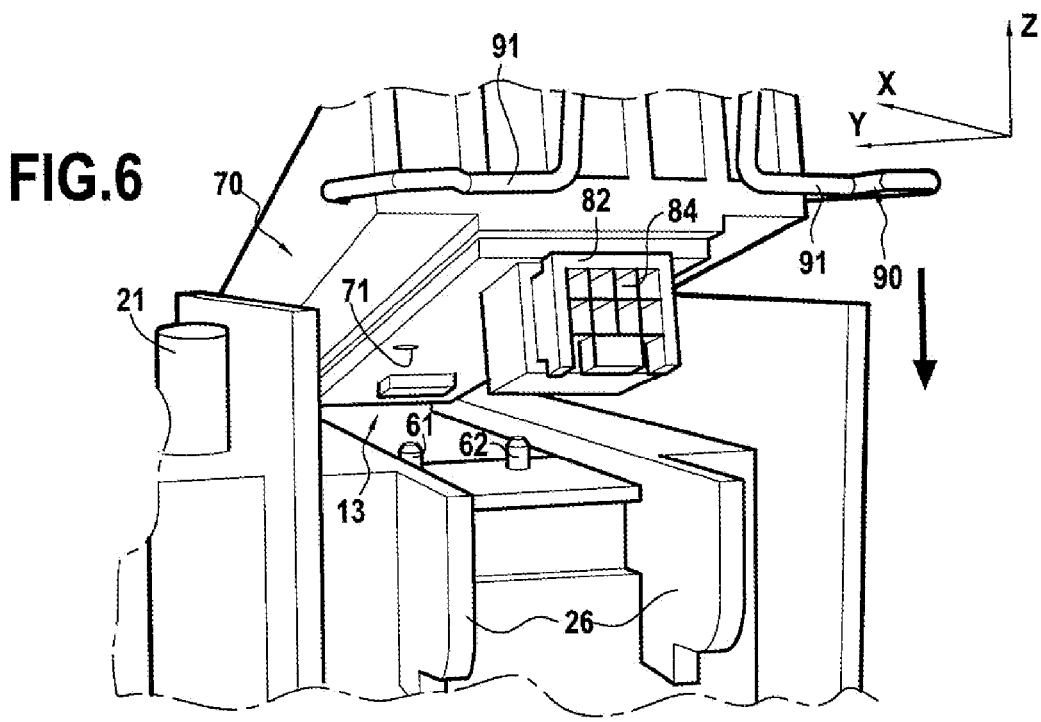
FIG. 6 is an enlargement of part of the illustration of FIG. 5, seen from another angle.
Figure 6:
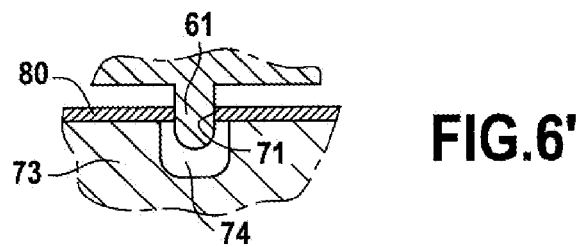
Figure 7:
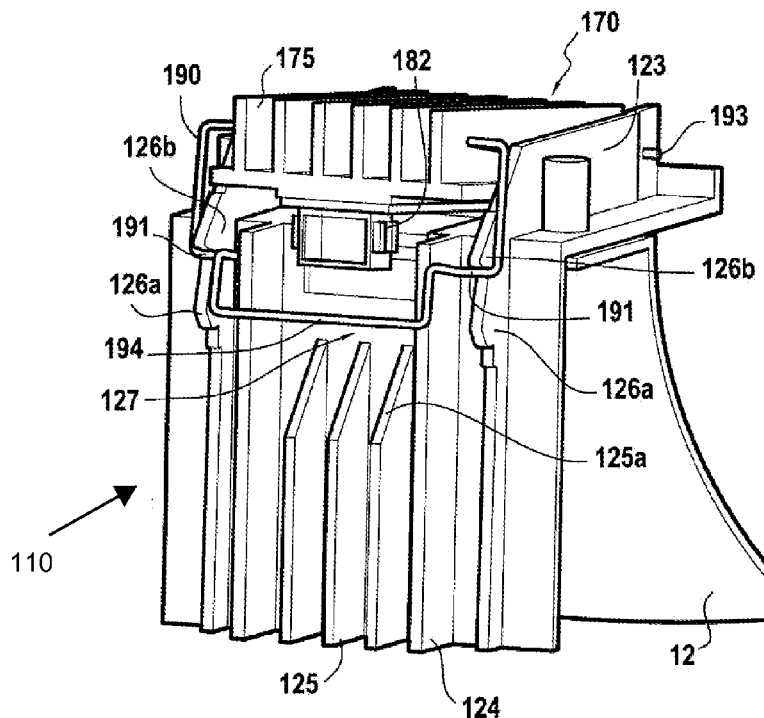
Figure 8:
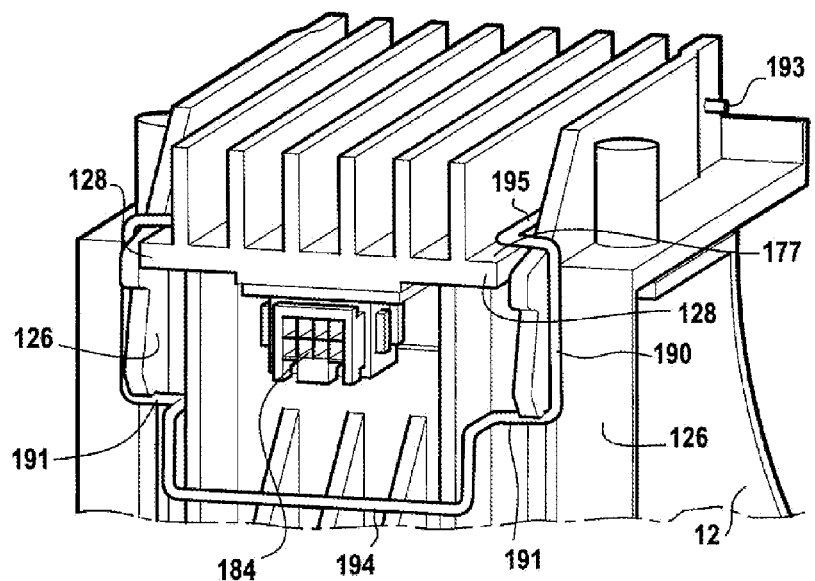
Figure 9:
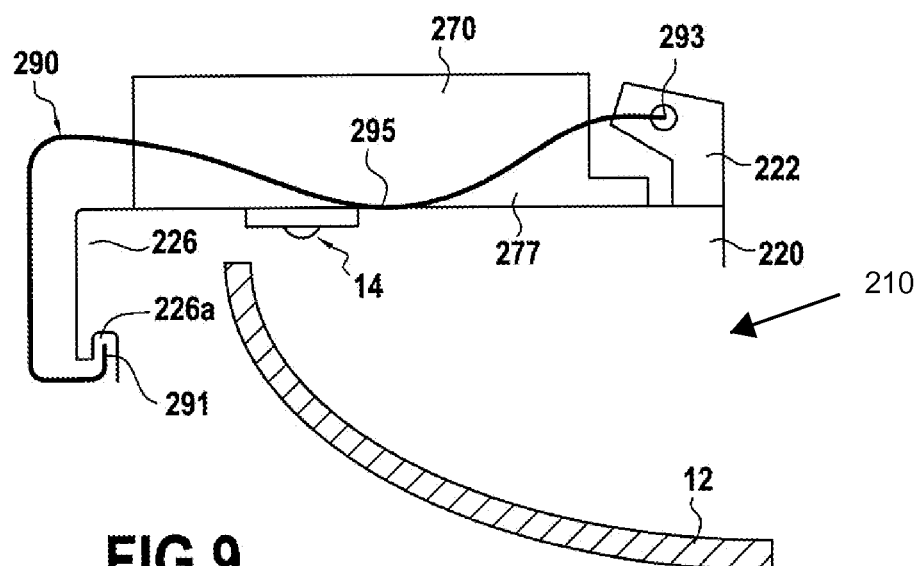
Figure 10:
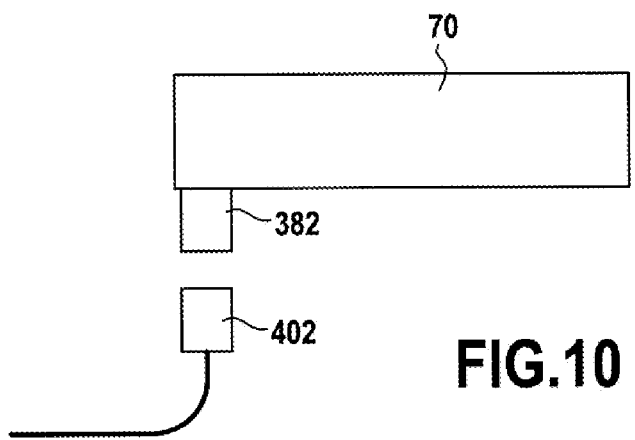
Figure 11:
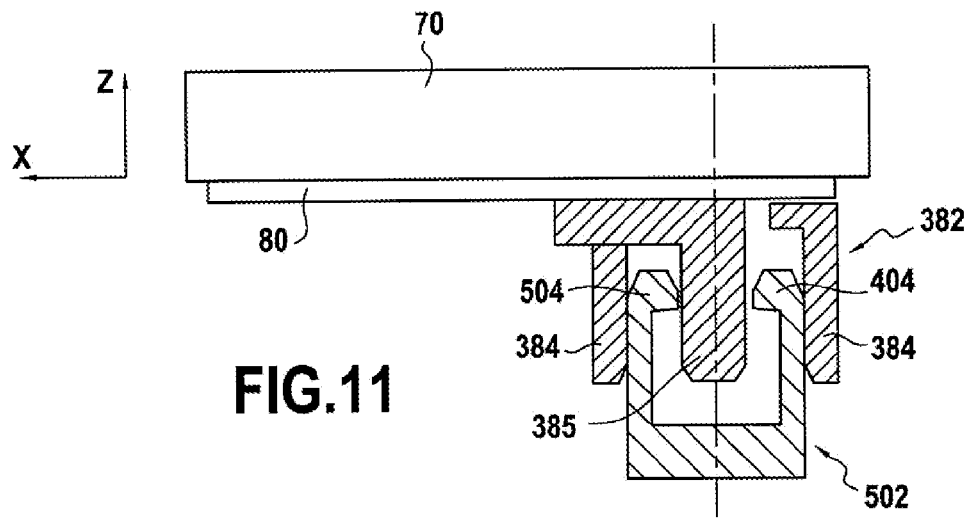
Figure 12:
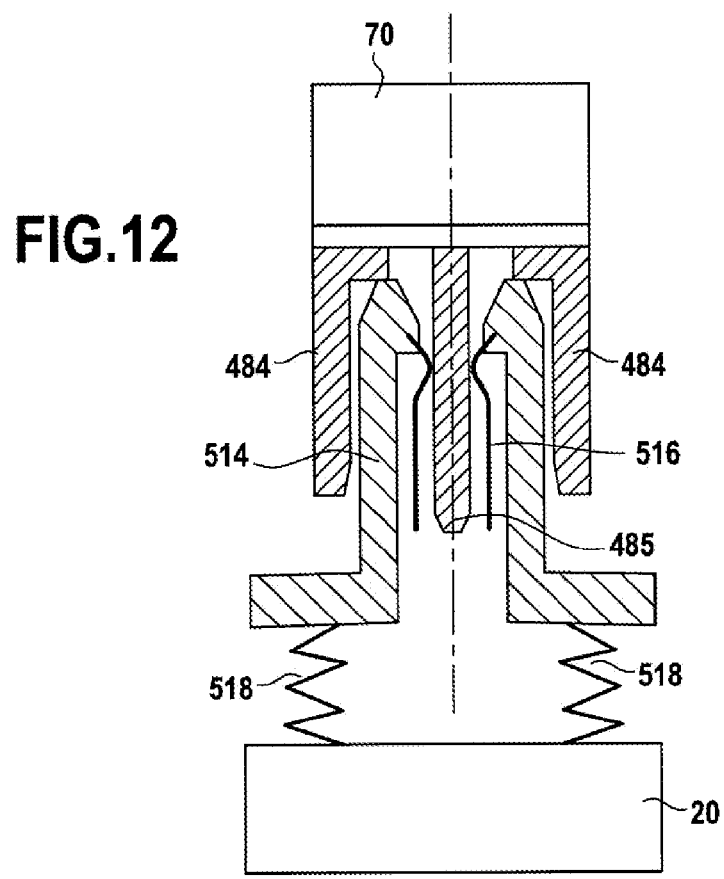

FIG. 6' is a schematic cross section showing the indexing area of the adapter in the optical module according to the first embodiment;

FIG. 7 is a perspective rear view of an optical module with its adapter, pre-fixed in the replacement position according to a second embodiment of the invention;

FIG. 8 is a zoom view of FIG. 7, but with the adapter fixed in the operating position;

FIG. 9 is a schematic representation of an optical module with its adapter according to a third embodiment of the invention;

FIG. 10 is a schematic representation of a possible arrangement of the connectors of the optical module and of the adapter according to the invention;

FIG. 11 is a schematic representation of a connection of the optical module to the adapter according to the invention; and FIG. 12 is a schematic representation of a variant connection of the optical module to the adapter according to the invention.

DETAILED DESCRIPTION OF THE PREFERRED EMBODIMENTS

The various elements appearing in more than one figure are given the same reference numerals, unless stated otherwise. Elements appearing in more than one figure will not be newly described in full or mentioned for every figure.

FIGS. 1 to 12 show three embodiments according to the invention. These illustrations are exemplary embodiments.

The optical module 10, 110 and 210 for a motor vehicle lighting and/or signaling device according to the invention comprises:
- a first optical deflection element 12, which in the case of these examples is a reflector 12,
- a support 20, 120 and 220 of the reflector 12, the reflector 12 being fixed to the support 20, 120 and 220, wherein the support 20, 120 and 220 comprises adapter fixing means 26, 126 and 226 capable of fixing an adapter to which a light source is fixed, or of receiving a fixing element of this adapter, and wherein the reflector 12 comprises adapter indexing means 61, 62 arranged so as to be capable of positioning this adapter relative to the reflector 12 according to two separate intersecting axes X, Y.

According to these embodiments, the indexing means 61, 62, shown in FIGS. 3 and 6 are studs 61, 62.

The support 20, 120 and 220 is a heat sink, and comprises:
- a material capable of conducting heat,
- contact surfaces 66 comprising part of this material, such as to transmit the heat of an element that may be in contact with the contact surfaces, for example the contact surfaces 76 of the adapter 70 shown in FIG. 4.

In general, the support 20, 120 and 220 may be a monolithic material, for example by being made of one piece of material. It may essentially consist of the material capable of conducting heat. The material capable of conducting heat may be metal, notably aluminum.

Figure 1:
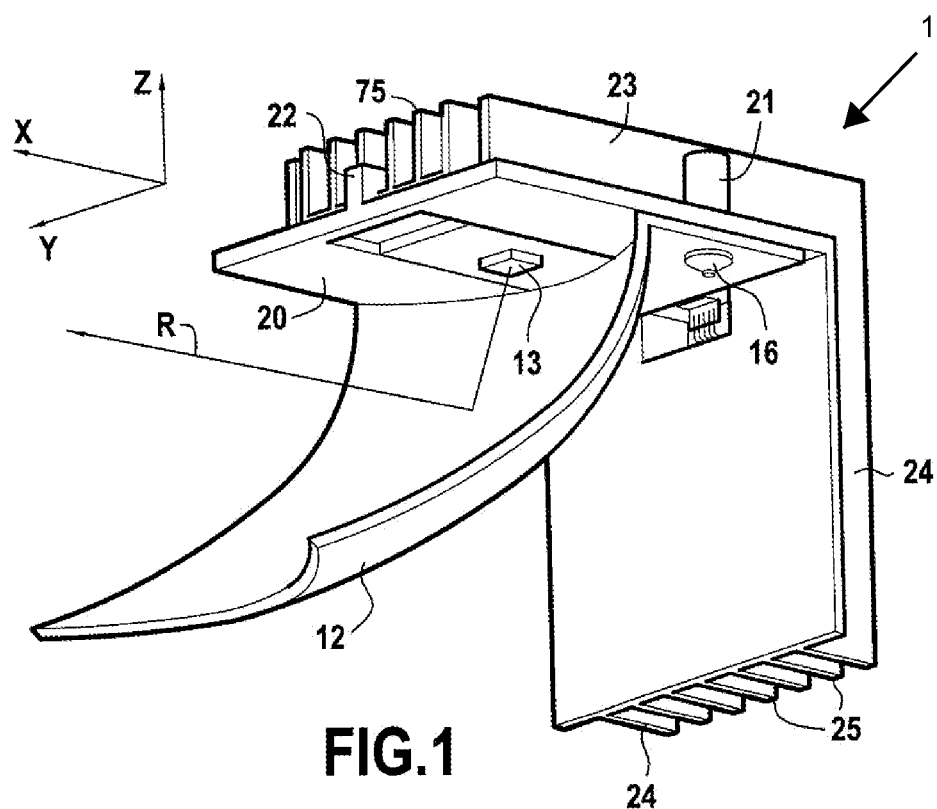
FIG. 1 is a perspective view of an optical module with its adapter according to a first embodiment of the invention.
Figure 2:
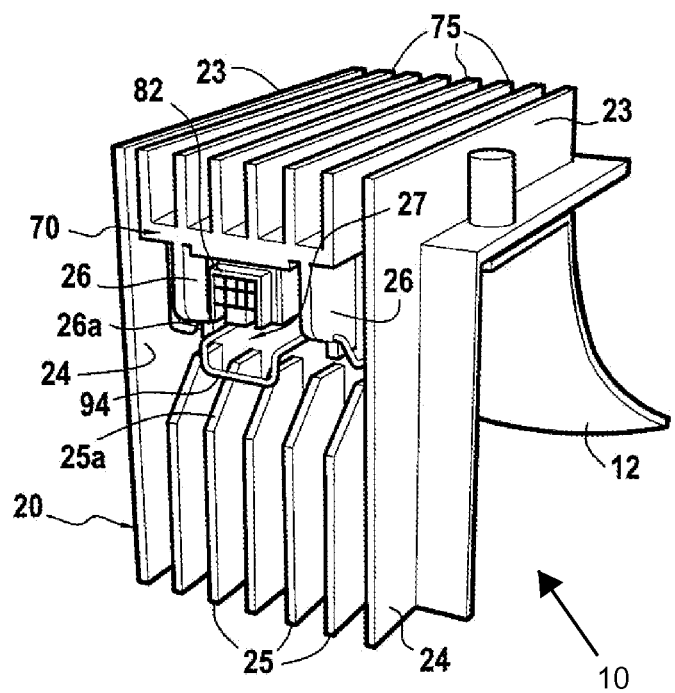
FIG. 2 is a view of the subject of FIG. 1, but taken from the rear.

As illustrated, the support 20, 120 and 220 comprises rear fins 24 and 25, or 124 and 125, located at the rear of the support 20, 120 and 220 and behind the optical deflection element 12 relative to the direction of propagation R along which the optical deflection element 12 is intended to deflect the rays. The direction of propagation R is shown in FIG. 1 only, but is the same in the various figures. This support 20, 120 and 220 therefore forms a finned radiator 24 and 25, or 124 and 125.

The support 20, 120 and 220 comprises:
- an opening 29 facing the optical deflection element 12, visible in FIGS. 1 and 3,
- guide fins 23, 123 on either side of this opening 29, notably parallel with one another,
- bearing surfaces 66 between this opening 29 and these guide fins 23,
- the guide fins 23, 123 being arranged so as to allow the adapter 70, 170, 270 to be guided in order to position it in contact with these bearing surfaces 66.

Figure 5:
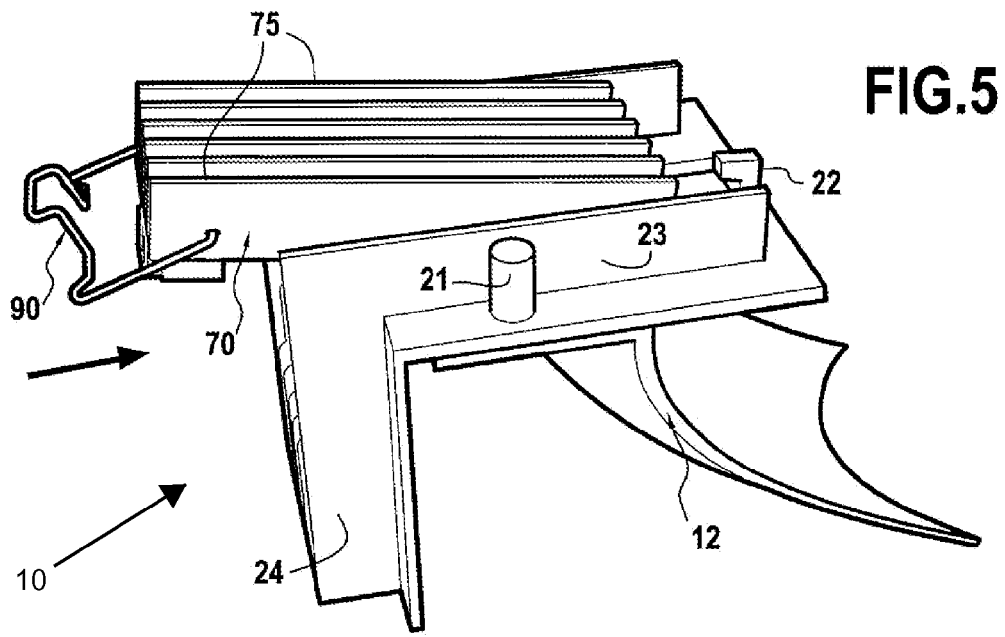
FIG. 5 shows the mounting of the adapter of FIG. 4 in the module of FIG. 3.

In fact, as can be seen in FIGS. 5 and 6, the adapter 70, 170, 270 according to the invention has a width less than, but close to, the distance between these guide fins 23, 123; this facilitates guiding and positioning during the replacement of the adapter 70, 170, 270.

According to the illustrated examples, these bearing surfaces 66 are the contact surfaces. Consequently they have the double function of providing thermal and mechanical contact.

In these examples, the optical module is a lighting module, for example in order to provide an illuminating beam, for example a low beam.

The adapter 70, 170, 270 is designed at the position of the opening 29 in such a way that the light source 13 fixed above has its general direction of emission orientated toward the concavity of the reflector 12. The latter reflects the light rays emitted by the light source 13 along the direction of propagation R, parallel to the longitudinal axis X, in the illustrated examples, the direction of propagation R parallel to the longitudinal axis X defining the forward direction in this case. The light source 13 provides downward illumination.

The support 20, 120 and 220 comprises in this case two plates joined in the general shape of an "L", at about 90° for example, and comprises:
- on a first branch of the L-shape located behind the module, the rear fins 24 and 25, 124 and 125,
- on a second branch of the L-shape, the guide fins 23.

The second branch may comprise other fins which are not shown.

The rear fins 25, 125 comprise a discontinuity 25a, 125a arranged so as to form a space free of fins 27, 127, in which is located at least a part of the adapter fixing means 26, 126, 226, in this case pairs of toothlike lugs. Each lug comprises at least one indentation capable of receiving a metal fixing rod 90, 190, 290 of the adapter 70, 170, 270.

In these exemplary embodiments, the adapter 70; 170; 270 of the light source 13 comprises:
- at least one light source 13,
- a printed circuit 80, to which the light source 13 is fixed and connected, complementary fixing means or rod 90, 177 or 277, capable of enabling the adapter 70, 170, 270 to be fixed,
- complementary indexing means 71, 72 formed on the printed circuit 80, arranged so that, when an element is positioned on the optical module relative to these complementary indexing means 71, 72, the adapter 70, 170, 270 is positioned relative to this element on two separate intersecting axes, in this case the longitudinal axis X and the transverse axis Y.

These complementary indexing means are apertures 71, 72, particularly holes passing through the printed circuit 80 from one side to the other.

The adapter 70, 170, 270 of the light source 13 comprises a support unit 73 to which the printed circuit 80, and therefore indirectly the light source 13, is fixed and connected.

As can be seen more precisely in FIG. 4, the light source 13 is an LED comprising a substrate 15 fixed to the printed circuit 80, by electrodes for example. The substrate 15 carries a photoemissive semiconductor element 14.

The support unit 73 is a radiator comprising:
fins 75, 175 and 275, and being arranged to dissipate the heat given off by this light source 13,
complementary fixing means or rod 90, 177 or 277, capable of enabling the adapter 70, 170, 270 to be fixed.

According to the invention, in general the adapter 70, 170, 270 or the support may carry a pivoted metal rod 90, 190, 290 which is made to be attached to or pressed against the support or the adapter 70, 170, 270 respectively.

Thus, according to the first embodiment shown in FIGS. 1 to 6, the fins 75 of the edges of the adapter 70 comprise a hole 64 (FIG. 4) through which the end 93 of a rod 90 passes. The end 93 of the metal rod 90 is freely rotatable in this hole 64, so as to form a pivot of the rod 90 on these two fins 75. The rod 90 is made in the shape of a loop which is not closed. Two ends 93 are therefore pivoted. The loop can thus swing downward to be attached to the adapter fixing lugs 26 formed on the support 20, the attached portion of the loop thus forming a fixing part 91.

The support 73 comprises a toothlike projecting guiding and retaining part 22 (FIGS. 1, 3 and 5).

As shown in FIGS. 5, 6 and 6', when the adapter 70 is placed in module 10, the adapter 70 slides on the contact surfaces 66 of the support 20, being guided transversely by the guide fins 23 of the support 20. It will slide until it is blocked by the projecting lug 22, which becomes housed between two fins 75 of the adapter 70, thus completing the guiding. The adapter 70 can then be lowered so that its contact surfaces 76, located on either side of the printed circuit, come into contact with the contact surfaces 66 of the module.

The studs 61, 62 will enter the through holes 71, 72, and index the LED 13 relative to the reflector 12, notably at the position of its focus.

As can be seen in FIG. 6', the support unit 73 comprises cavities 74 facing the through holes 71, each through hole 71 opening entirely into its own cavity 74. The studs 61 pass through the printed circuit 80 into these cavities 74. Consequently the studs 61 do not have to be designed exactly to match the size of the holes 71 in the printed circuit 80.

When the adapter 70 has been positioned and pressed against the support 20, the rod 90 is lowered toward the rear branch of the L-shape of the support 20, and becomes attached to the adapter fixing lugs 26.

The adapter 70 is thus kept pressed against the support 20 by the rod 90 on the one hand, and by the lug 22 on the other hand.

In the other embodiments, the principle of the mounting of the adapter 170, 270 is generally the same, but with the differences described below.

The metal rod 190, 290 is pivoted at one end on the support 120, 220, the rod further comprising a pressing part 195, 295, to be fixed by pressing to the adapter 170, 270, the rod 190, 290 being arranged to allow compression fixing of the adapter 170, 270 to the module, by bearing on the bearing surfaces 177, 277 of the adapter 170, 270.

In the second embodiment, the through hole in which the end 193 of the rod 190, 290 is pivoted is arranged on a fin 123 (FIG. 7) of the support 120 of the reflector 12.

In the third embodiment, the through hole in which the end 293 of the rod 190, 290 is pivoted is arranged on a projecting part 222 (FIG. 9) separate from the fins 123.

In these various embodiments, the metal rod 90, 190, 290 comprises an attachment part 91, 191, 291 that is made to interact with an indentation 26a, 126a, 226a of the adapter fixing means 26, 126, 226.

The metal rod 90, 190, 290 comprises a graspable portion 94, 194, 294 in the form of a loop intended to be gripped to enable the rod 90, 190, 290 to be detached from the adapter fixing means 26, 126, 226, for example by being grasped by an operator's finger.

In the second embodiment and in the third embodiment, the pressing portion 195, 295 is located between the attachment part 191, 291 and the pivoted end 193, 293. Thus the adapter 170, 270 is kept pressed against the support 120, 220 by the attachment of the attachment part 191, 291 on the one hand, and by the fixing part 195, 295 on the other hand.

In the second embodiment, the adapter fixing means 126 comprise another indentation 126b capable of receiving the metal fixing rod 190, in such a way that each indentation 126a, 126b defines a different fixing position of the metal rod 190. Thus, as shown in FIG. 7, the rod 190 is positioned in the intermediate indentation 126b, allowing the module to be pre-positioned before its final fixing, for example in order to adjust it correctly before it is lowered. The rod 190 is then placed in the final indentation 126a to fix the adapter 170 finally in the support 120. Clearly, the term "final" is to be interpreted as meaning "final for the purpose of making the module operable", rather than final for the whole service life of the module, since according to the invention this attachment is removable to allow the light source to be replaced by the withdrawal and replacement of the adapter.

As may be seen, according to the invention the support unit comprises by the adapter 70, 170, 270 is a radiator whose fins 75, 175, 275 are arranged to dissipate the heat given off by the LED 13. This is even more effective because they are orientated upwards.

In the three embodiments, the adapter 70, 170, 270 comprises a connector 82, 182 or 282 connected to the LED 13, and the support 20, 120 and 220 also comprises a connector 82, 182.

As shown in FIG. 10, according to the invention, these connectors 82, 182 are arranged one above the other when the adapter 70 is positioned in the support 20, 120, 220, so that, during assembly, the simple fact of lowering the adapter 70, 170, 270 onto the module causes the connectors 82, 182 to be plugged into one another.

As shown in FIG. 11, the connector 382 of the adapter 70 may comprise connecting pins 384, 385, the connector 502 of the support 20 being electrically connected by the insertion of its pins 504, 404 between those of the connector of the adapter 70.

As shown in FIG. 12, the pins of the connector of the support 20 comprise blades 516 mounted on more rigid parts 514 between which the central pin of the connector of the adapter 70 is inserted, the rigid parts 514 being housed between the walls 484 of the connector of the adapter 70. The rigid parts 514 are connected to the support 20 by means of a spring 518 enabling the dimensional tolerances to be reduced for mounting during the fixing of the adapter 70.

According to one embodiment, the contact surfaces 76 of the adapter 70 and of the support 20 are in direct contact. The optical element have a clearance on an axis perpendicular to the tangent to these contact surfaces 76, that is to say on the vertical axis Z in the illustrated embodiments. Thus on this axis the arrangement is made according to the support 20. This clearance may, for example, be in the range from 0.1 to 2 mm, preferably from 0.5 to 1 mm, or preferably 0.5 mm.

According to a variant embodiment, the contact surfaces 66 of the support 20 and/or the contact surfaces 76 of the adapter are covered with a compressible heat-conducting element, notably a filled silicone, for example a PAD 900 silicone. This compressible element may have a thickness of about 229 μm. The adapter is in direct contact with the optical deflection element 12, in such a way that the adapter 70, 170, 270 is indexed relative to the optical deflection element 12 on the vertical axis Z.

It can be seen here that, in three embodiments, the contact surfaces 66 and 76 are in direct or indirect thermal contact, so that the adapter 70, 170, 270 and the support 20, 120, 220 of the optical deflection element 12 form a single heat sink, the fins being located in some cases (75, 23, 24, 25; 175, 123, 124, 125; 275, 223, 224, 225) on the adapter 70, 170, 270, and in other cases on the support 20, 120, 220.

This provides a radiator enabling heat to be removed directly from the base of the LED 13, and an extensive exchange surface.

While the system, apparatus, process and method herein described constitute preferred embodiments of this invention, it is to be understood that the invention is not limited to this precise system, apparatus, process and method, and that changes may be made therein without departing from the scope of the invention which is defined in the appended claims.

What is claimed is:

1. An optical module for a motor vehicle lighting and/or signaling device, comprising:
    a first optical deflection element;
    a support of said first optical deflection element, said first optical deflection element being fixed to said support;
    wherein said support comprises adapter fixing means capable of fixing an adapter to which at least one light source is fixed, or of receiving a fixing element of said adapter, and wherein said first optical deflection element comprises adapter indexing means arranged so as to be capable of positioning said adapter relative to said first optical deflection element on two separate intersecting axes (X,Y);
    an opening facing said first optical deflection element;
    guide fins on either side of said opening; and
    bearing surfaces between said opening and said guide fins;
    said guide fins being arranged so as to allow a unit having a width close to the distance between said guide fins to be guided in order to position said unit in contact with said bearing surfaces;
    said adapter being fixed to said optical deflection element support using said adapter fixing means; and
    said at least one light source fixed directly or indirectly to said adapter and emitting light rays toward said first optical deflection element, said support being arranged to allow the passage of these light rays;
    wherein said adapter comprises complementary indexing means interacting with said adapter indexing means so that said adapter and said first optical deflection element are positioned on two separate intersecting axes relative to one another.

2. The optical module as claimed in claim 1, wherein said adapter indexing means of said support comprise apertures and/or studs.

3. The optical module as claimed in claim 1, wherein said support is a heat sink and comprises:
    a material capable of conducting heat; and
    contact surfaces comprising part of said material, such as to transmit said heat of an element that may be in contact with said contact surfaces.

4. The optical module as claimed in claim 1, wherein said support also comprises a connector intended to be connected, on the one hand, to an electrical power supply of a vehicle, and on the other hand to said at least one light source.

5. The optical module as claimed in claim 1, wherein said adapter fixing means comprise at least one lug with at least one indentation capable of receiving a metal fixing rod.

6. The optical module as claimed in claim 1, wherein said support comprises a metal rod pivoted at one end on said support, said metal rod further comprising a fixing part to be fixed to said adapter, said metal rod being arranged to allow compression fixing to said optical module.

7. The optical module as claimed in claim 1, wherein said bearing surfaces are contact surfaces, wherein said contact surfaces and/or said bearing surfaces are covered with a compressible heat-conducting element, notably a filled silicone.

8. The optical module as claimed in claim 1, wherein said complementary indexing means are through holes or apertures.

9. The optical module as claimed in claim 1, comprising a metal rod pivoted at one end on said adapter, said metal rod further comprising a fixing part to be fixed to an element such as an optical module, said metal rod being arranged to allow compression fixing of said adapter to said element.

10. The optical module as claimed in claim 1, wherein said at least one light source is a light-emitting diode.

11. The optical module as claimed in claim 1, wherein said support comprises a toothlike projecting part housed between two fins of said adapter.

12. The optical module as claimed in claim 1, wherein said adapter comprises a connector connected to said at least one light source, and wherein said support also comprises a connector, one of said connectors being plugged into the other.

13. The optical module as claimed in claim 3, wherein said support comprises rear fins located at a rear of said support and behind said first optical deflection element relative to a direction of propagation (R) along which said first optical deflection element is intended to deflect the rays.

14. The optical module as claimed in claim 5, wherein said adapter fixing means comprise another indentation capable of receiving said metal fixing rod, in such a way that each of said at least one indentation defines a different fixing position of said metal fixing rod.

15. The optical module as claimed in claim 8, wherein said adapter comprises a support unit on which a printed circuit is fixed, said apertures being holes passing through said printed circuit from one side to the other, said support unit comprising cavities facing said through holes or aperture, each of said through hole or aperture opening entirely into its own cavity.

16. The optical module as claimed in claim 9, wherein the pivot comprises a through hole in which an end of said metal rod is freely rotatable.

17. The optical module as claimed in claim 9, wherein the pivot is arranged on a fin of said adapter, or on a projecting part separate from said fins of said adapter.

18. The optical module as claimed in claim 7, wherein said support is a heat sink and comprises:
    a material capable of conducting heat; and
    contact surfaces comprising part of said material, such as to transmit said heat of an element that may be in contact with said contact surfaces.

* * * * *